(12) United States Patent
Wang et al.

(10) Patent No.: US 9,663,685 B2
(45) Date of Patent: May 30, 2017

(54) PHOTOCURABLE ADHESIVE COMPOSITION AND USE OF THE SAME

(71) Applicants: Henkel (China) Company Limited, Shanghai (CN); Henkel US IP LLC, Rocky Hill, CT (US)

(72) Inventors: James Wang, Shanghai (CN); Daoqiang Lu, Chandler, AZ (US)

(73) Assignees: Henkel IP & Holding GmbH, Duesseldorf (DE); Henkel AG & Co. KGaA, Duesseldorf (DE)

(*) Notice: Subject to any disclaimer, the term of this patent is extended or adjusted under 35 U.S.C. 154(b) by 0 days.

(21) Appl. No.: 14/162,288

(22) Filed: Jan. 23, 2014

(65) Prior Publication Data

US 2014/0131306 A1     May 15, 2014

Related U.S. Application Data

(63) Continuation of application No. PCT/CN2012/078228, filed on Jul. 5, 2012.

(30) Foreign Application Priority Data

Jul. 25, 2011 (CN) .......................... 2011 1 0211108

(51) Int. Cl.
```
C09K 13/06    (2006.01)
C09J 109/00   (2006.01)
C09J 4/06     (2006.01)
C08F 290/04   (2006.01)
C09J 113/00   (2006.01)
G03F 7/027    (2006.01)
G03F 7/038    (2006.01)
C08L 33/06    (2006.01)
```

(52) U.S. Cl.
CPC ......... *C09J 109/00* (2013.01); *C08F 290/048* (2013.01); *C09J 4/06* (2013.01); *C09J 113/00* (2013.01); *G03F 7/027* (2013.01); *G03F 7/0388* (2013.01); *C08L 33/066* (2013.01)

(58) Field of Classification Search
CPC ...... C09J 109/00; C09J 109/06; C09J 111/00; H01S 5/0425; H01S 5/12; G03F 7/027; G03F 7/0388
USPC ....... 430/315, 322, 325, 326; 252/79.3, 79.4
See application file for complete search history.

(56) References Cited

U.S. PATENT DOCUMENTS

| | | | |
|---|---|---|---|
| 5,190,818 A | 3/1993 | Sakai | |
| 5,256,717 A | 10/1993 | Stauffer et al. | |
| 6,325,885 B1 | 12/2001 | Harrison | |
| 7,241,540 B2 * | 7/2007 | St. Clair | C08F 297/044 430/18 |
| 8,067,094 B2 * | 11/2011 | Benson et al. | 428/447 |
| 8,208,197 B2 * | 6/2012 | Asakura | G02B 5/208 252/589 |
| 2007/0037911 A1 | 2/2007 | Sugi et al. | |
| 2010/0148160 A1 | 6/2010 | Cao | |
| 2010/0227941 A1 * | 9/2010 | Ueda | G03F 7/0037 522/170 |
| 2010/0244328 A1 * | 9/2010 | Yonezawa | B82Y 10/00 264/447 |
| 2011/0189421 A1 * | 8/2011 | Sherman et al. | 428/36.91 |
| 2011/0269868 A1 | 11/2011 | Kanai et al. | |

FOREIGN PATENT DOCUMENTS

| | | |
|---|---|---|
| CN | 101370879 | 2/2009 |
| CN | 102533132 | 7/2012 |
| JP | 2005060465 | 3/2005 |
| WO | 2009067113 | 5/2009 |

OTHER PUBLICATIONS

International Search Report issued in connection with International Patent Application No. PCT/CN2012/078228 mailed on Oct. 18, 2012.

* cited by examiner

*Primary Examiner* — Lan Vinh

(57) ABSTRACT

The present invention relates to a photocurable adhesive composition and the use of the same. Specifically, said photocurable adhesive composition mainly comprises, based on 100 parts by weight of the adhesive composition, component A: from 70 to 99 parts by weight of one or more polymers carrying (meth)acryloxyl group; component B: from 0 to 30 parts by weight, preferably from 0 to 25 parts by weight of one or more (meth)acrylates monomers; component C: from 0.5 to 10 parts by weight of at least one UV absorber; and component D: from 0 to 5 parts by weight of antioxidant. The present invention also relates to the use of the adhesive composition mentioned above in the production of an ITO substrate for temporarily bonding a substrate and a temporary carrier and going through a high temperature processing, for example, at a temperature of ≥160° C., preferably, from 160° C. to 260° C., more preferably from 240° C. to 250° C.

14 Claims, No Drawings

PHOTOCURABLE ADHESIVE COMPOSITION AND USE OF THE SAME

The present invention relates to a photocurable adhesive composition, especially, a photocurable adhesive composition capable of providing a stable temporary-bonding at high temperature. The present invention also relates to the use of the photocurable adhesive composition, in particular, the use of the photocurable adhesive composition in the production of a substrate with patterned indium tin oxide (ITO) for temporarily bonding the substrate with a temporary carrier. Furthermore, the present invention relates to a method of producing ITO substrate, wherein the adhesive composition of the present invention is used.

BACKGROUND

In the production of a substrate with patterned ITO, the substrate is adhered to a temporary carrier in order to protect one surface of the substrate, and then is subjected to multiple processing steps including the deposition of ITO at high temperature. After the patterned ITO substrate is fabricated, it needs to be separated from the temporary carrier. Therefore, it is required that the adhesive used in the above process can stand the high temperature in the process, can be thoroughly eliminated from the substrate, and does not contaminate the substrate resulting in adverse influence in the following processing. The patterned ITO substrate obtained from the invention can be used in display devices such as touch panel application.

Polysiloxane-based adhesives are commonly used for temporarily bonding the substrate with the temporary carrier in the art. However, one problem of such polysiloxane-based adhesives is that the unadhered upper surface of the substrate is contaminated by the volatile components or weigh-losing components of the polysiloxane-based adhesives generated at the high temperature processing, rendering great difficulty of applying photoresist thereon in the following step. Even though various solvents are used to clean the unadhered upper surface, still there is polysiloxane residue left on the substrate, resulting in poor spreading of special chemicals, such as optical adhesive and photoresist, on the upper surface of the substrate.

U.S. Pat. No. 5,190,818 discloses an adhesive composition for temporary adhesive bonding of paper sheets, which achieves the temporary adhesive bonding by pressing, and the bonded sheets can be separated later by an appropriate peeling force. The disclosed peelable adhesive composition comprises, as a mixture: (a) an aqueous emulsion or latex of rubber; (b) particles of silica gel; and (c) starch. Said adhesive composition optionally contains other additives. The bonding of the adhesive composition disclosed in U.S. Pat. No. 5,190,818 is achieved by pressing at ambient temperature, and the bonding strength is not very high.

U.S. Pat. No. 5,256,717 discloses a hot melt adhesive composition comprising: a) about 5 to 50% by weight of a polymer selected from the group consisting of: i) an isotatic thermoplastic polybutene-1/ethylene copolymer containing from about 5.5 to 10% by weight ethylene, and ii) low density polyethylene; b) from about 3 to 65% by weight of a solid benzoate plasticizer; c) from about 10 to 90% by weight of a tackifier; and d) from about 0 to 2% by weight of an antioxidant. The curing of the hot melt adhesive composition disclosed in U.S. Pat. No. 5,256,717 is achieved by cooling, and the disclosed composition is in liquid state at high temperature, for example, higher than 150° C. Therefore, the hot melt adhesive composition disclosed in this document can not provide a stable bond at high temperature.

U.S. Pat. No. 6,325,885 B1 provides a temporary pressure-sensitive adhesive providing a temporary bond between an article and a horizontal surface. Said pressure-sensitive adhesive is based on polyorganosiloxane gum.

US 2010/0148160 A1 discloses a laminating adhesive, which can be used and processed at room temperature, comprising: a reactive liquid oligomer and/or polymer; a liquid monomer reactive with the liquid oligomer and/or polymer; and an initiator. Furthermore, US 2010/0148160 A1 discloses the use and the processing of the laminating adhesive at room temperature, particularly, at a temperature no higher than 65° C.

Therefore, there still is the need to find a photocurable adhesive composition capable of temporarily bonding the substrate and the carrier at high temperature, achieving a stable bond there between, and causing no contamination on the substrate.

DESCRIPTION OF THE INVENTION

To solve the above-mentioned problem, the present invention provides a photocurable adhesive composition, said adhesive composition mainly comprises, based on 100 parts by weight of the adhesive composition:

Component A: from 70 to 99 parts by weight of one or more polymers carrying (meth)acryloxyl group;

Component B: from 0 to 30 parts by weight, preferably 0 to 25 parts by weight of one or more (meth)acrylates monomers;

Component C: from 0.5 to 10 parts by weight of at least one UV absorber (photoinitiator); and Component D): from 0 to 5 parts by weight of antioxidant.

The adhesive composition according to the invention may further contain other additives commonly used in the art, such as, adhesion promoter, organic/inorganic fillers and the like, as long as the required properties of the adhesive composition can be satisfied.

In another aspect, the present invention provides the use of the adhesive composition in the production of ITO substrate for temporarily bonding the substrate with a temporary carrier, and going through a high temperature processing, for example, a temperature of equal to or more than 160° C., preferably, from 160° C. to 260° C., more preferably, from 240° C. to 250° C.

In still another aspect, the present invention provides a method of producing ITO substrate, wherein the adhesive composition as described above is used.

The adhesive formed by the adhesive composition of the invention may stand high temperature processing, for example, a temperature of equal to or more than 160° C., preferably, from 160° C. to 260° C., more preferably, from 240° C. to 250° C.; have sufficient flexibility at high temperature; and have no problems such as cracks, bubbles and delaminations. Therefore, the substrate may be held in place during the process of ITO fabrication. Furthermore, the cured adhesive bonding may be deassembled by physical separation, leaving no residue/contamination on the substrate compared with polysiloxanes adhesives.

All technical terms and scientific terms used herein have the same meanings as those commonly understood by those skilled in the art, unless indicated otherwise. In case that the meanings understood by those skilled in the art conflict with the meanings defined herein, the meanings defined herein shall be used as the criterion.

All percentages, parts, proportions and the like mentioned herein are based on weight.

When an amount, a concentration or other values or parameters is/are expressed in form of a range, a preferable range, or a preferable upper limit value and a preferable lower limit value, it should be understood as that any ranges obtained by combining any upper limit or preferable value with any lower limit or preferable value are specifically disclosed, without considering whether the obtained ranges are clearly mentioned in the context. The numerical ranges mentioned herein are meant to include both end values of the ranges and also all integers or fractions included in the ranges, unless indicated otherwise.

Subject matter of this invention is a photocurable adhesive composition, which mainly comprises, based on 100 parts by weight of the adhesive composition:

component A: from 70 to 99 parts by weight of one or more polymers carrying (meth)acryloxyl group;

component B: from 0 to 30 parts by weight, preferably from 0 to 25 parts by weight of one or more (meth)acrylates monomers;

component C: from 0.5 to 10 parts by weight of at least one UV absorber; and component D: from 0 to 5 parts by weight of antioxidant;

wherein, said polymers carrying (meth)acryloxyl group are preferably derived from polybutadiene, polyisoprene, polyisobutylene or copolymers thereof, and preferably have a $T_g$ value of from −100° C. to 20° C., and preferably have an average functionality of the (meth)acryloxyl group of more than 0 and ≤3; and the hardness of the cured adhesive composition determined according to ASTM D2240 is preferably from sh00 30 to sh00 70.

It is preferred that the polymers carrying (meth)acryloxyl group are derived from polybutadiene, polyisoprene, polyisobutylene or copolymers thereof, and have a $T_g$ value of from −100° C. to 20° C., and have an average functionality of the (meth)acryloxyl group of more than 0 and ≤3; and that the hardness of the cured adhesive composition determined according to ASTM D2240 is from sh00 30 to sh00 70.

The photocurable adhesive composition comprises component A, which is one or more polymers carrying (meth)acryloxyl group.

The term "(meth)acryloxyl group" is used to represent acryloxyl, methacryloxyl group or their combination. Similar, the term "(meth)acrylic acid" represents acrylic acid, methacrylic acid or their combination; the term "(meth)acrylate" represents acrylate, methacrylate or their combination; and the term "(meth)acrylamide" represents acrylamide, methacrylamide or their combination. The term " . . . (meth)acryl . . . " in this document covers " . . . acryl . . . " and/or "methacryl . . . ".

The structure of (meth)acryloxyl group is $CH_2=CRC(O)O-$, wherein R is preferably H or $CH_3$. The (meth)acryloxyl group may be at any position in the molecule, preferably at the end of the backbone and/or in the side chain.

Said polymers carrying (meth)acryloxyl group are preferably derived from polybutadiene, polyisoprene, polyisobutylene or copolymers thereof, and have preferably a $T_g$ value of from −100° C. to 20° C., in particular, from −70° C. to −20° C. The average functionality of the (meth)acryloxyl group in the polymers is preferably more than 0 and ≤3, in particular, from 0.5 to 3. Said (meth)acryloxyl group may be at any position in the polymers, preferably, at the end of polymer chain. The term "average functionality" mentioned above refers to the average number of the (meth)acryloxyl group in one molecular chain.

$T_g$ is the glass-transition temperature, which can be determined by usual means like dynamic thermomechanical analysis or dynamic scanning calorimetry.

Representative examples of said polymers carrying (meth)acryloxyl group include polybutadiene carrying (meth)acryloxyl group, polyisoprene carrying (meth)acryloxyl group, butadiene-styrene copolymer carrying (meth)acryloxyl group, polyisobutylene carrying (meth)acryloxyl group, butyl rubber carrying (meth)acryloxyl group, bromoisobutylene-isoprene copolymer carrying (meth)acryloxyl group, chloroiso butylene-isoprene copolymer carrying (meth)acryloxyl group, and combinations thereof.

Said component A is preferably present in an amount of from 70 to 99 parts by weight based on 100 parts by weight of the photocurable adhesive composition.

The photocurable adhesive composition preferably comprises component B, which is one or more (meth)acrylates monomers.

The present adhesive composition may preferably comprise (meth)acrylates monomers that are in liquid state at room temperature (25° C.). The (meth)acrylates monomers may be used to adjust the viscosity and bonding properties of the adhesive composition due to their low viscosity at room temperature.

There is no special limitation on the (meth)acrylates monomers used in the present invention, and monofunctional (meth)acrylates and multiple functional (meth)acrylates (such as bisfunctional (meth)acrylates) may be used.

Said (meth)acrylate preferably is chosen from alkyl(meth)acrylate, alkenyl(meth)acrylate, and heterocyclo(meth)acrylate, and combinations thereof.

Said alkyl preferably is an alkyl group having from 1 to 20 carbon atoms, preferably, from 1 to 10 carbon atoms, which may have one or more substituents preferably selected from an alkyl group having from 1 to 16 carbon atoms, for example 1 to 10 carbon atoms or 2 to 16 carbon atoms, an aryloxyl group having from 6 to 10 carbon atoms, a cycloxyl group having from 2 to 10 carbon atoms, hydroxyl and the like.

Said alkenyl preferably is an alkenyl group having from 2 to 20 carbon atoms, preferably, from 2 to 10 carbon atoms, which may have one or more substituents preferably selected from an alkyl group having from 1 to 16 carbon atoms, for example 1 to 10 carbon atoms or 2 to 16 carbon atoms, an alkoxyl group having from 1 to 10 carbon atoms, an aryloxyl group having from 6 to 10 carbon atoms, a cycloxyl group having from 2 to 10 carbon atoms, hydroxyl and the like.

Said heterocyclo preferably is a heterocyclo group having from 2 to 20 carbon atoms, preferably, from 2 to 10 carbon atoms, and having a hetero atom selected from nitrogen and oxygen. The heterocyclo group may have one or more substituents preferably selected from an alkyl group having from 1 to 10 carbon atoms, an alkoxyl group having from 1 to 10 carbon atoms, an aryloxyl group having from 6 to 10 carbon atoms, a cycloxyl group having from 2 to 10 carbon atoms, hydroxyl and the like.

Representative examples of the (meth)acrylates monomers include methyl (meth)acrylate, ethyl (meth)acrylate, butyl(methyl)acrylate, 2-(2-ethoxyethoxy) ethyl acrylate, tetrahydrofurfury (meth)acrylate, lauryl acrylate, isooctyl acrylate, isodecyl acrylate, 2-phenoxyethyl acrylate, 2-ethylhexyl (meth)acrylate, isobornyl (meth)acrylate, dicyclopentenyloxyethyl (meth)acrylate, dicyclopentadienyl (meth)acrylate, 2-hydroxyethyl (meth)acrylate, 2-hydroxypropyl (meth)acrylate, 2-hydroxybutyl (meth)acrylate, caprolactone acrylate, morpholine (meth)acrylate, hexanediol di(meth)acrylate, ethyleneglycol dimethacrylate, trimethylolpropane triacrylate, pentaerythritol tetrahydrofuranacrylate and combinations thereof.

Said component B is preferably present in an amount of from 0 to 30 parts by weight, more preferably from 0 to 25 parts by weight, even more preferably, from 0 to 20 parts by weight, for example from 0.1 to 20 parts by weight or from 5 to 20 parts by weight, in particular, from 0 to 10 parts by weight, for example from 5 to 10 parts by weight, based on 100 parts by weight of the photocurable adhesive composition.

As component C an UV absorber (photoinitiator) is comprised in the composition of the present invention.

There is no special limitation on the UV absorbers used in the present invention, and those commonly used in the art may be used herein. For example, 2,2-dimethoxy-1,2-diphenylethan-1-one, trimethylbenzoyl diphenylphosphine oxide, 1-hydroxycyclohexyl benzophenone, 2-methyl-1-[4-(methylthio)phenyl]-2-morpholinopropan-1-one, ethyl-2,4,6-trimethylbenzoylphenylphosphinate, and combinations thereof may be used.

Said component C is preferably present in an amount of from 0.5 to 10 parts by weight, more preferably, from 1 to 8 parts by weight, even more preferably, from 1 to 2 parts by weight, based on 100 parts by weight of the photocurable adhesive composition.

As component D an antioxidant is preferably comprised in the composition of the present invention.

There is no special limitation on the antioxidants used in the present invention, and those commonly used in the art may be used herein. The antioxidant used in the present invention may be primary antioxidant or a combination of primary antioxidant and secondary antioxidant, preferably, the combination of primary antioxidant and secondary antioxidant. The antioxidants that may be used herein preferably include hindered phenols, benzotriazoles, and phosphites. Specifically, the antioxidants suitably used in the present invention include, but are not limited to, Irganox 1010, Irganox 245, Irganox 1076, Irganox 1135, Irganox 1098 (tradenames, all from Ciba Specialty Chemicals); Tinuvin series (from BASF CO. Ltd.) including Tinuvin 292, Tinuvin 756, Tinuvin 791, Tinuvin 783 and the like.

Said component D is preferably present in an amount of from 0 to 5 parts by weight, for example from 0.001 to 5 parts by weight, more preferably, from 0 to 3 parts by weight, more preferably, from 0 to 0.5 parts by weight, based on 100 parts by weight of the photocurable adhesive composition.

The adhesive composition according to the invention may further contain other additives commonly used in the art, such as, adhesion promoter (for example, tetrahydrofuran methacrylate, (3-glycidoxypropyl)trimethoxysilane), organic/inorganic fillers (for example, fumed silica, glass, silicon fine powders) and the like, as long as the required properties of the adhesive composition can be satisfied.

Another subject matter of this invention is the use of the adhesive composition of the present invention in the production of ITO substrate as well as the method of producing ITO substrate.

The use of the adhesive composition according to the present invention in the production of a patterned ITO substrate for temporarily bonding a substrate with a temporary carrier and going through a high temperature processing at a temperature of equal to or higher than 160° C. is a further subject matter of this invention.

An inventive use, wherein said high temperature is a temperature within a range of from 160° C. to 260° C., especially, from 240° C. to 250° C., is a preferred embodiment of the invention.

A further subject matter of this invention is a method of producing ITO substrate, preferably a patterend ITO substrate, using the adhesive composition as described above, which comprises the steps of:

applying the adhesive composition between a temporary carrier and a substrate;

curing the adhesive composition by irradiation with UV light;

subjecting the cured adhesive composition to a process of producing patterned ITO at high temperature preferably of equal to or higher than 160° C.; and physically separating the temporary carrier and the substrate, and washing off the cured adhesive composition from the substrate using an organic solvent that can dissolve the cured adhesive composition.

The above steps are described in details as preferred embodiments below.

Step 1) applying the adhesive composition between a temporary carrier and a substrate in a preferred embodiment:

As the temporary carrier of the present invention, any materials that can stand high temperature, such as, equal to or higher than 260° C., may preferably be used, and the preferred examples of which include, but are not limited to, non-porous materials of glass, ceramics, metals and the like.

As the substrate of the present invention, the substrates commonly used in the production of patterned ITO substrates may be used, and the preferred examples of which include, but are not limited to, non-porous materials of glass, ceramics, metals and the like.

The preferred manners of applying the adhesive composition between a temporary carrier and a substrate preferably include a manner of firstly applying the adhesive composition to the temporary carrier and then adhering one side of the substrate to the adhesive composition; or preferably a manner of firstly applying the adhesive composition to one side of the substrate and then adhering the side to the temporary carrier; or preferably a manner of applying the adhesive composition to both one side of the substrate and the temporary carrier, and then adhering them together. Preferably make sure that the substrate and the temporary carrier are entirely adhered when conducting the adherence. That is to say, the contacting surfaces of the substrate and the adhesive composition as well as of the temporary carrier and the adhesive composition should preferably be entirely covered by the adhesive composition. In particular, the contacting surface of the substrate and the adhesive composition should be entirely covered by the adhesive composition.

There is no special limitation on the amount of the adhesive composition applied between the temporary carrier and the substrate. From the viewpoint of the requirements in practical manufacture and economicity, the thickness of the adhesive composition between the temporary carrier and the substrate is controlled in a range of preferably from 0.05 mm to 0.2 mm, more preferably, from 0.1 mm to 0.15 mm.

Step 2) curing the adhesive composition by irradiation with UV light in a preferred embodiment:

The laminate comprising the temporary carrier, the substrate and the adhesive composition obtained in step 1) is preferably placed under a light source and cured by light irradiation.

The light generated by the light source mainly is ultraviolet light, particularly, comprising a wavelength of between 200 nm and 450 nm. More preferably, a UV light having a wavelength of between 200 nm and 400 nm is used.

The adhesive composition is cured by applying sufficient radiation energy to the adhesive composition. The expression "sufficient radiation energy" used above intends to mean the radiation energy consumed for curing the adhesive composition, which may be achieved for those skilled in the art by adjusting the radiation time according to the radiation power used. In the present invention, the radiation energy preferably is from 2500 to 5000 mJ/cm$^2$, more preferably, from 3500 to 4500 mJ/cm$^2$.

The curing by light irradiation in step 2) may be achieved by one-time irradiation, or by two-time or more irradiations.

If there is excessive cured adhesive overflowed on the unadhered surface of the substrate (i.e., the surface that does not adhere to the temporary carrier), the excessive adhesive then can preferably be washed off by an organic solvent (which include but are not limited to isopropanol, acetone and butanone) that may dissolve the adhesive. The wash step may preferably be conducted after the cure is done, when the one-time irradiation manner is used. The wash step may preferably be conducted after the cure is done or at the intervals of each irradiation, when the two-time or more irradiations manner is used.

In a preferred embodiment, the curing by light irradiation in step 2) is achieved by one-time irradiation, wherein, the radiation power is 100 mW/cm$^2$, the radiation time is 40 seconds, and the radiation energy is 4000 mJ/cm$^2$.

In another preferred embodiment, the curing by light irradiation in step 2) is achieved by two-time irradiations, wherein, in the first radiation, the radiation power is 100 mW/cm$^2$, the radiation time is 10 seconds, and the radiation energy is 1000 mJ/cm$^2$; and in the second radiation, the radiation power is 100 mW/cm$^2$, the radiation time is 30 seconds, and the radiation energy is 3000 mJ/cm$^2$. The overflowed adhesive is preferably washed off by isopropanol after the first radiation.

Step 3) subjecting the cured adhesive composition to a process of producing patterned ITO at high temperature in a preferred embodiment:

Firstly, the unadhered surface of the substrate is preferably covered with a mask having desired pattern, and an indium tin oxide (ITO) target is deposited on the substrate preferably using the method of direct current magnetron sputtering, and then, the temperature of the system preferably is slowly raised to a temperature within a range of preferably from 240° C. to 250° C., for example, at a speed of 20° C. per minute, which is kept preferably for from 1 to 3 hours, thereby, the first step of high temperature deposition is completed. Then, the temperature is lowered to a temperature of preferably from 160° C. to 180° C., and preferably a black photoresist (i.e., etchant) is coated, and the temperature is kept for preferably 1 to 2 hours, thereby, the electroforming heat polymerization is completed, and desired reticular structures are formed by the heat polymerization of photoresist. Finally, a laminate of patterned ITO glass substrate is obtained.

The photoresist is removed preferably by acid wash or alkaline wash that is commonly used in the industries.

In this step, the adhesive can effectively fix the glass substrate to be processed, and at the same time protect the adhered surface between the substrate and the temporary carrier from being affected by the etchant. Therefore, it is preferred for the adhesive used in the process to have better heat resistance in a high temperature environment, so as to make the cracks, bubbles and delaminations not occur on the adhered surface. Or else, the etchant may penetrate into the next layer, and this makes the protection invalid.

Step 4) physically separating the temporary carrier and the substrate, and washing off the cured adhesive composition from the substrate using an organic solvent that can dissolve the cured adhesive composition in a preferred embodiment:

After the ITO substrate is patterned, the system is preferably cooled to room temperature, and the temporary carrier is physically separated from the patterned ITO substrate. The adhesive on the substrate is washed off by an organic solvent such as isopropanol, acetone, butanone and the like.

In a preferred embodiment, the method of the present invention proceeds as follows:

The adhesive composition according to the present invention is uniformly coated on a glass temporary carrier, then a glass substrate is covered thereon, the thickness of the adhesive composition is controlled within a range of from 0.1 mm to 0.15 mm, and the adhered surfaces should be entirely covered by the adhesive composition.

Conducting the first irradiation having an irradiation energy of about 1000 mJ/cm$^2$ to the glass substrate using an ultraviolet source having a wavelength of from 200 nm to 450 nm, the irradiation power is about 100 mW/cm$^2$, and the irradiation time is 10 seconds. After the first irradiation, the excessive adhesive overflowed around the substrate is washed off using isopropanol. Then a second irradiation having an irradiation energy of about 3000 mJ/cm$^2$ is conducted, for example, using an irradiation power of about 100 mW/cm$^2$ and an irradiation time of 30 seconds.

The upper, unadhered surface of the glass substrate is covered with a metal chromium mask having desired patterns, and the ITO indium tin oxide target is applied onto the glass substrate using a method of direct current magnetron sputtering, and then, the temperature of the system is slowly raised to a temperature within a range of from 240° C. to 250° C., for example, at a speed of 20° C. per minute, and kept for from 1 to 3 hours, thereby, the first step of high temperature deposition is completed. Then, the temperature is lowered to a temperature within a range of from 160° C. to 180° C., and a black photoresist (e.g., photosensitizer FSR-YS-13 from CHENG KWANG PRINTING MATERIALS CORPORATION) is coated, and the temperature is kept for 1 to 2 hours, thereby, the electroforming heat polymerization of the black photoresist is completed, and desired reticular structures are formed by the heat polymerization. Finally, a preparative layer of the patterned ITO glass substrate is obtained.

The photoresist (i.e., etchant) is removed by acid wash or alkaline wash that is commonly used in the industries.

After the processing of the upper surface of the glass substrate is completed and the system is cooled to room temperature, the glass temporary carrier is physically separated from the glass substrate. The adhesive residue on the substrate is washed off by isopropanol.

The adhesive obtained in the present invention exhibits better heat resistance in a high temperature environment, and no cracks, bubbles and delaminations occurring on the adhered surface. Therefore, the adhesive effectively protects the adhered surface of the glass substrate from being affected by the etchant.

EXAMPLES

The present invention will be described in details in the following by way of examples. However, the protection scope of the present invention is not limited to these examples.

Materials used in the examples methacrylated polyisoprene A: UC-102 (trade name, from Kuraray Co., Ltd., functionality: 2, Mw=17,000, and $T_g=-60°$ C.;

methacrylated polyisoprene B: UC-203 (trade name, from Kuraray Co., Ltd., functionality: 3, Mw-35,000, and $T_g=-60°$ C.);

pentaerthrityl tetrakis[3-(3,5-di-tert-butyl-4-hydroxyphenyl)propionate]: Irganox 1010 (trade name, from Ciba Specialty Chemicals);

isooctyl 3,5-di-tert-butyl-4-hydroxyphenylpropinate: Irganox 1135 (trade name, from Ciba Specialty Chemicals);

3,9-bis{2-[3-(3-t-butyl-4-hydroxy-5-methylphenyl)-propionyloxy]-1,1-dimethyl-ethyl}-2,4,8,10-tetraoxaspiro[5.5]undecane: ADK STAB AO-80 (trade name, from Adeka Corp.);

trimethylbenzoyl diphenylphosphine oxide: Lucirin TPO (trade name, from BASF);

methacrylated polybutadiene: Ricacryl 3100 (tradename, from Cray Valley Hydrocarbon Specialty Chemicals, functionality: 2, Mn-5,100, and Viscosity=25,000 cps/25° C.);

acrylate grafted polybutadiene A: BAC-45 (trade name, from San Esters Corp., functionality (terminal): 2, and Mn=about 3,000);

acrylate grafted polybutadiene B: CN307 (trade name, from Sartomer Co. Ltd., functionality: 2, and Viscosity=about 8,000 cPs/25° C.);

urethane acrylate grafted polysiloxane: BRS-14320 (trade name, from Bomar Specialties Co., functionality: 2, Viscosity=about 18,000 cP/50° C.; and $T_g=-112°$ C.).

Test Methods:

Measurement of Viscosity of the Adhesive Composition:

The viscosity of the adhesive composition is measured using Brookfield Viscometer (dynamic, RVT DV-II CP52, at 25° C.) according to ASTM D1084-1997. The shear rate is viscosity-dependent:

| Adhesive compositions | Shear rate (RPM) |
|---|---|
| Example 1 | 15 |
| Example 2 | 25 |
| Example 3 | 1 |
| Example 4 | 2.5 |
| Example 5 | 40 |
| Comparative example 1 | 2.5 |
| Comparative example 2 | 40 |
| Comparative example 3 | 10 |

Measurement of Hardness of the Cured Adhesive Composition:

Firstly, the adhesive composition is cured by the following procedures: an even polyethylene film having a thickness of 0.18 mm is placed on a glass plate having a size of 150 mm*150 mm*4 mm, then a stainless steel frame having a thickness of 2 mm is placed onto the polyethylene film, about 30 g of liquid adhesive composition is charged into the space restricted by the frame, and thereon, another one even polyethylene film having a thickness of 0.18 mm is placed, and then, another glass plate having a size of 150 mm*150 mm*4 mm is placed on the polyethylene film, thereby, a test sample is obtained. The test sample is cured for 2 minutes (one minute each side) using UV light having a UVA magnitude of 100 mW/cm². Three test pieces having the same size and a thickness of 2 mm are cut out, the hardness of which are tested using Durometer at a thickness of 6 mm. The hardness Shore 00 of the cured adhesive composition is determined according to ASTM D2240.

Measurement of Cross Bonding Strength of the Cured Adhesive Composition:

Firstly, the adhesive composition is cured by the following procedures: the adhesive composition is applied between two glass plates each having a size of 56 mm*30 mm*5 mm, and the applied thickness of the adhesive composition is 100 μm. The obtained sample of glass/adhesive composition/glass is irradiated using a UV light source having a wavelength of from 200 nm to 450 nm (Model: UVALOC1000, from Loctite), the irradiation energy is about 3000 mJ/cm², the irradiation power is about 100 mW/cm² and the irradiation time is about 30 seconds.

A cross bonding strength measurement is conducted to the cued sample by pulling the two glass plates apart in the directions perpendicular to the glass surfaces using a tensile strength tester (Model: Instron 5540, from Instron) at 25° C. The cross bonding strength (unit: MN) is calculated by dividing the force needed to pull the two glass plates apart by the contact area of the two glass plates.

Method of Measuring the Weight Loss of the Adhesive Composition During the Bonding at 250° C.:

The measurement is conducted by a traditional thermogravimetry as below: under the protection of nitrogen gas, 15 mg of cured adhesive is weighted into a crucible, and the temperature is raised from room temperature to 250° C. at a speed of 20° C. per minute under the nitrogen protection, and kept at 250° C. for 1 hour, then, the weight loss within the one hour is calculated.

Analysis of the bonding stabilization at high temperature of the adhesive composition: The adhesive composition is applied between a temporary carrier and a substrate, and subjected to a high temperature processing (e.g., a process of producing patterned ITO), thereafter, visually check whether there is cracks, delaminations and bubbles occurring between the temporary carrier and the substrate. The occurrence of any one of cracks, delaminations and bubbles will be deemed as that the bonding stabilization at high temperature of the adhesive composition is not good.

Determination of Contamination of the Adhesive Composition to the Substrate:

The contamination of the adhesive composition is qualitatively expressed by the spreading properties of photoresist on the glass substrate. Specifically, 0.3 g photoresist used in the next procedure is dropped onto the unadhered surface of the glass substrate that has been subjected to the ITO application and a high temperature treatment at from 240° C. to 250° C. Visually check whether the photoresist can spread slowly or can be coated on the surface of the glass substrate, so as to determine the contamination of the adhesive composition residue. If the photoresist (glue) is in a form of procumbent, hard to spread or hard to be coated on the glass, this indicates that the glass substrate is contaminated by the adhesive residue, and the application of the photoresist at a temperature of from 160° C. to 180° C. in the following procedure will be affected.

Example 1: Adhesive Composition 1 According to the Invention

The photocurable adhesive composition 1 is formulated according to the following composition.

| | |
|---|---:|
| Component A UC-102 | 76.6 parts by weight |
| Component B 2-hydroxyethyl methacrylate | 0.2 parts by weight |
| Component B 2-phenoxyethyl acrylate | 2 parts by weight |
| Component B lauryl acrylate | 20 parts by weight |
| Component C 1-hydroxycyclohexyl benzophenone | 0.9 parts by weight |
| Component C Lucirin TPO | 0.1 parts by weight |
| Component D Irganox 1010 | 0.10 parts by weight |
| Component D Irganox 1135 | 0.05 parts by weight |
| Component D ADK STAB AO-80 | 0.05 parts by weight |

Method of Formulating the Adhesive Composition 1:

Each of the above components (100 g in total) are weighted into a plastic barrel having a capacity of 150 g, and dispersed at a high speed of from 2000 to 2400 rpm using a SpeedMixer™ mixer from FlackTech Inc for 10 minutes. Thereby, the adhesive composition 1 is obtained and the obtained adhesive composition 1 is clear.

Various performances of the obtained adhesive composition 1 are tested and the results are shown in table 1.

Example 2: Adhesive Composition 2 According to the Invention

The adhesive composition 2 is formulated according to the method of example 1 except that the components are as follows, and the obtained adhesive composition 2 is clear:

| | |
|---|---:|
| Component A Ricacryl 3100 | 78 parts by weight |
| Component B lauryl acrylate | 20 parts by weight |
| Component C 1-hydroxycyclohexyl benzophenone | 1.9 parts by weight |
| Component D butylated hydroxytoluene (BHT) | 0.05 parts by weight |
| Component D Tinuvin 292 | 0.05 parts by weight |

Various performances of the obtained adhesive composition 2 are tested and the results are shown in table 1.

Example 3: Adhesive Composition 3 According to the Invention

The adhesive composition 3 is formulated according to the method of example 1 except that the components are as follows, and the obtained adhesive composition 3 is clear:

| | | |
|---|---|---:|
| Component A | UC-102 | 99 parts by weight |
| Component C | 1-hydroxycyclohexyl benzophenone | 1 parts by weight |

Various performances of the obtained adhesive composition 3 are tested and the results are shown in table 1.

Example 4: Adhesive Composition 4 According to the Invention

The adhesive composition 4 is formulated according to the method of example 1 except that the components are as follows, and the obtained adhesive composition 4 is clear:

| | | |
|---|---|---:|
| Component A | UC-102 | 88 parts by weight |
| Component B | 2-phenoxyethyl acrylate | 10 parts by weight |
| Component B | 2-hydroxypropyl methacrylate | 0.9 parts by weight |
| Component C | 1-hydroxycyclohexyl benzophenone | 1 parts by weight |
| Component D | Irganox 1010 | 0.1 parts by weight |

Various performances of the obtained adhesive composition 4 are tested and the results are shown in table 1.

Example 5: Adhesive Composition 5 According to the Invention

The adhesive composition 5 is formulated according to the method of example 1 except that the components are as follows, and the obtained adhesive composition 5 is clear:

| | |
|---|---:|
| Component A BAC-45 | 94.8 parts by weight |
| Component B isobornyl methacrylate | 4 parts by weight |
| Component B 2-hydroxypropyl methacrylate | 0.1 parts by weight |
| Component C 1-hydroxycyclohexyl benzophenone | 1 parts by weight |
| Component C Lucirin TPO | 0.1 parts by weight |

Various performances of the obtained adhesive composition 5 are tested and the results are shown in table 1.

Comparative Example 1: Comparative Adhesive Composition 1

The comparative adhesive composition 1 is formulated according to the method of example 1 except that the components are as follows, and the obtained comparative adhesive composition 1 is clear:

| | | |
|---|---|---:|
| Component A | UC-203 | 60 parts by weight |
| Component B | dicyclopentenyloxyethyl methacrylate | 38 parts by weight |
| Component C | 1-hydroxycyclohexyl benzophenone | 2 parts by weight |

Various performances of the obtained comparative adhesive composition 1 are tested and the results are shown in table 1.

Comparative Example 2: Comparative Adhesive Composition 2

The adhesive composition 2 is formulated according to the method of example 1 except that the components are as follows, and the obtained comparative adhesive composition 2 is clear:

| | | |
|---|---|---:|
| Component A | CN307 | 65 parts by weight |
| Component B | lauryl acrylate | 33 parts by weight |
| Component C | 1-hydroxycyclohexyl benzophenone | 2 parts by weight |

Various performances of the obtained comparative adhesive composition 2 are tested and the results are shown in table 1.

Comparative Example 3: Comparative Adhesive Composition 3

The comparative adhesive composition 3 is formulated according to the method of example 1 except that the components are as follows, and the obtained comparative adhesive composition 3 is clear:

| | | |
|---|---|---:|
| Component A | BRS-14320 | 75 parts by weight |
| Component B | lauryl acrylate | 23 parts by weight |
| Component C | 1-hydroxycyclohexyl benzophenone | 2 parts by weight |

Various performances of the obtained comparative adhesive composition 3 are tested and the results are shown in table 1.

TABLE 1 various performances of the adhesive compositions

| Adhesive compositions | Viscosity (mPa · s) | Hardness sh00 | Cross bonding strength (MPa) | Weigh loss at high temperature (250° C.) |
|---|---|---|---|---|
| Example 1 | 4500 | sh00 50 | 0.40 | about 4.6% |
| Example 2 | 1900 | sh00 50 | 0.50 | <5% |
| Example 3 | 76000 | sh00 70 | 0.30 | <5% |
| Example 4 | 18000 | sh00 60 | 0.40 | <5% |
| Example 5 | 850 | sh00 70 | 0.60 | <5% |
| Comparative example 1 | 17000 | sh00 75 | 0.50 | >6% |
| Comparative example 2 | 900 | sh00 90 | 0.60 | >6% |
| Comparative example 3 | 5000 | sh00 40 | 0.40 | <5% |

Use of the Adhesive Composition in the Production of ITO Substrates

Each adhesive composition of the above examples and comparative examples are used in the production of the ITO substrate, specifically, as following:

The adhesive composition is uniformly coated on a glass temporary carrier, then a glass substrate to be processed having a size of 50 mm*100 mm*2 mm is covered thereon, the thickness of the adhesive composition is controlled within a range of from 0.1 mm to 0.15 mm, and make sure the adhered surfaces are entirely covered by the adhesive composition.

Conducting the first irradiation having an irradiation energy of about 1000 mJ/cm² to the glass substrate using an ultraviolet light source having a wavelength of from 200 nm to 450 nm (Model: UVALOC1000, from Loctite), the irradiation power is about 100 mW/cm², and the irradiation time is 10 seconds. After the first irradiation, the excessive adhesive overflowed around the substrate is washed off using isopropanol. Then a second irradiation having an irradiation energy of about 3000 mJ/cm² is conducted, using an irradiation power of about 100 mW/cm² and an irradiation time of 30 seconds.

The unadhered surface of the glass substrate is covered with a metal chromium mask having desired patterns, and the ITO (indium tin oxide) target (for example, indium tin oxide target from Changsha Asian Light Economic Trade Co. Ltd.) is applied on the glass substrate using the method of direct current magnetron sputtering, and then, the temperature of the system is slowly raised to a temperature within a range of from 240° C. to 250° C., for example, at a speed of 20° C. per minute, and kept for from 1 to 3 hours, thereby, the first step of the high temperature deposition of ITO is completed. Then, the temperature is lowered to a temperature within a range of from 160° C. to 180° C., and a black photoresist (e.g., photosensitizer FSR-YS-13 from CHENG KWANG PRINTING MATERIALS CORPORATION) is coated, and the temperature is kept for 1 to 2 hours, thereby, the electroforming heat polymerization of the black photoresist is completed, and desired reticular structures are formed by the heat polymerization of the photoresist. Finally, a preparative layer of the patterned ITO glass substrate is obtained.

The photoresist (i.e., etchant) is removed by acid wash or alkaline wash that is commonly used in the industries.

After the processing of the upper surface of the glass substrate is completed and the system is cooled to room temperature, the glass temporary carrier is physically separated from the glass substrate. The adhesive residue on the substrate is washed off by isopropanol.

The heat resistance of the adhesive exhibited under a high temperature is evaluated by visually checking whether cracks, bubbles or delaminations occur on the adhered surface. The contamination of the adhesive composition residue on the substrate is determined by the spreading property of the photoresist that is used at a temperature of from 160° C. to 180° C. on the glass substrate that has been undergone ITO deposition at a temperature within a range of from 240° C. to 250° C. Table 2 shows the parameters during the production of ITO substrate using each adhesive composition mentioned above as well as the test results.

TABLE 2 parameters during the production and the test results

| Adhesive compositions | Thickness of the applied adhesive composition μm | Temperature and time of ITO deposition ° C./h | Processing temperature and time of the photo resist ° C./h | Heat resistance of the adhesive | Contamination of the adhesive composition residue |
|---|---|---|---|---|---|
| Example 1 | 100 μm | 250/2 | 160/1.5 | No cracks, bubbles and delaminations | Spreading well |
| Example 2 | 100 μm | 250/2 | 160/1.5 | No cracks, bubbles and delaminations | Spreading well |
| Example 3 | 100 μm | 250/3 | 160/1.5 | No cracks, bubbles and delaminations | Spreading well |
| Example 4 | 150 μm | 250/2 | 160/1.5 | No cracks, bubbles and delaminations | Spreading well |
| Example 5 | 100 μm | 250/1 | 180/1 | No cracks, bubbles and delaminations | Spreading well |
| Comparative example 1 | 100 μm | 250/2 | 160/2 | Large amount of bubbles generated* | — |
| Comparative example 2 | 100 μm | 250/2 | 160/1.5 | cracks* | — |
| Comparative example 3 | 100 μm | 250/2 | 160/1.5 | No cracks, bubbles and delaminations | Can not spread |

*indicates that bubbles or cracks occur at high temperature, and the etchant used in the process penetrates into the lower layer of the adhesive, and protection effect of the adhered adhesive is invalid.

It can be seen from table 2 that compared with polysiloxanes adhesives (comparative example 3), the adhesive compositions of the present invention exhibit excellent heat resistance during the production of ITO substrate at high temperature, and hardly leave residue contaminating the substrate, therefore, the coating and polymerization of photoresist at a temperature of from 160° C. to 180° C. is facilitated. When the hardness of the cured adhesive is less than or equals to sh00 70, the adhesive composition exhibits excellent heat resistance; however, when the hardness of the cured adhesive equals to or is bigger than sh00 75, bubbles or cracks occur in the cured adhesive at high temperature, and thus the protection fails.

What is claimed is:

1. A photocurable adhesive composition, said adhesive composition comprises, based on 100 parts by weight of the adhesive composition:

component A: from 70 to 99 parts by weight of one or more polymers carrying a (meth)acryloxyl group;

component B: from 0.1 to 20 parts by weight of one or more (meth)acrylates monomers;

component C: from 0.5 to 10 parts by weight of at least one UV photoinitiator; and component D: from 0.01 to 5 parts by weight of antioxidant;

wherein said polymers carrying a (meth)acryloxyl groups of component A are selected from polybutadiene carrying a (meth)acryloxyl group, polyisoprene carrying a (meth)acryloxyl group, butadiene-styrene copolymer carrying a (meth)acryloxyl group, polyisobutylene carrying a (meth)acryloxyl group, butyl rubber carrying a (meth)acryloxyl group, bromoisobutylene-isoprene copolymer carrying a (meth)acryloxyl group, chloroiso butylene-isoprene copolymer carrying a (meth)acryloxyl group, and combinations thereof and have a Tg value of from −100° C. to 20° C., and an average functionality of the (meth)acryloxyl group of more than 0 and ≤3;

wherein said UV photoinitiator is selected from the group consisting of 2,2-dimethoxy-1,2-diphenylethan-1-one, trimethylbenzoyl diphenylphosphine oxide, 1-hydroxycyclohexyl benzophenone, 2-methyl-1-[4-(methylthio)phenyl]-2-morpholinopropan-1-one, ethyl-2,4,6-trimethylbenzoylphenylphosphinate, and combinations thereof, and wherein the hardness of the cured adhesive composition when cured by exposure to radiation at one or more energy levels, determined according to ASTM D2240 is from sh00 30 to sh00 70, and wherein the cured adhesive composition can withstand processing temperatures of 160° C. to 260° C.

2. The adhesive composition according to claim 1, wherein said component A is present in an amount of from 80 to 99 parts by weight.

3. The adhesive composition according to claim 1, wherein the hardness of the cured adhesive composition is from sh00 40 to sh00 70.

4. The adhesive composition according to claim 1, wherein the Tg value of component A is from −70° C. to −20° C.

5. The adhesive composition according to claim 1, wherein said polymers carrying a (meth)acryloxyl group have an average functionality of the (meth)acryloxyl group of from 0.5 to 3.

6. The adhesive composition according to claim 1, wherein said component B is selected from alkyl (meth)acrylate, alkenyl (meth)acrylate, and heterocyclo (meth)acrylate; said alkyl is an alkyl group having from 1 to 20 carbon atoms, which may have one or more substituents; said alkenyl is an alkenyl group having from 2 to 20 carbon atoms, which may have one or more substituents; and said heterocyclo is a heterocyclo group having from 2 to 20 carbon atoms and having a hetero atom selected from nitrogen and oxygen, which may have one or more substituents; said one or more substituents may be selected from an alkyl group having from 1 to 10 carbon atoms, an alkoxyl group having from 1 to 10 carbon atoms, an aryloxyl group having from 6 to 10 carbon atoms, a cycloxyl group having from 2 to 10 carbon atoms, and hydroxyl.

7. The adhesive composition according to claim 1, wherein said component B is selected from methyl (meth)acrylate, ethyl (meth)acrylate, butyl (methyl)acrylate, 2-(2-ethoxyethoxy) ethyl acrylate, tetrahydrofurfuryl (meth)acrylate, lauryl acrylate, isooctyl acrylate, isodecyl acrylate, 2-phenoxyethyl acrylate, 2-ethylhexyl (meth)acrylate, isobornyl (meth)acrylate, dicyclopentenyloxyethyl (meth)acrylate, dicyclopentadienyl (meth)acrylate, 2-hydroxyethyl (meth)acrylate, 2-hydroxypropyl (meth)acrylate, 2-hydroxybutyl (meth)acrylate, caprolactone acrylate, morpholine (meth)acrylate, hexanediol di(meth)acrylate, ethyleneglycol dimethacrylate, trimethylolpropane triacrylate, pentaerythritol tetrahydrofuranacrylate and combinations thereof.

8. A process of using the adhesive composition according to claim 1, comprising the steps of Providing a patterned ITO substrate for temporarily bonding a substrate with a temporary carrier, Providing the adhesive composition to at least one of the substrate or the temporary carrier, and Exposing the adhesive composition to processing temperatures of equal to or higher than 160° C.

9. The process according to claim 8, wherein said temperature is within a range of from 160° C. to 260° C.

10. A method of producing a patterned ITO substrate, said method comprises the steps of:

a. applying the adhesive composition according to any one of claims 1-5, 6-7 between a temporary carrier and a substrate;

b. curing the adhesive composition by irradiation with UV light;

c. subjecting the cured adhesive composition to a process of producing a patterned ITO at a high temperature of equal to or higher than 160° C.; and d. physically separating the temporary carrier and the substrate, and washing off the cured adhesive composition from the substrate using an organic solvent that can dissolve the cured adhesive composition.

11. The method according to claim 10, wherein said substrate is a glass substrate.

12. The method according to claim 10, wherein said temporary carrier is a glass temporary carrier.

13. The method according to claim 10, wherein said high temperature is within a range of from 160° C. to 260° C.

14. The method according to claim 10, wherein said organic solvent is isopropanol, acetone or butanone.

\* \* \* \* \*

UNITED STATES PATENT AND TRADEMARK OFFICE
CERTIFICATE OF CORRECTION

PATENT NO. : 9,663,685 B2  
APPLICATION NO. : 14/162288  
DATED : May 30, 2017  
INVENTOR(S) : James Wang and Daoqiang Lu Page 1 of 1

It is certified that error appears in the above-identified patent and that said Letters Patent is hereby corrected as shown below:

In the Specification

Column 6, Line 6: Change "patterend" to -- patterned --.

Column 10, Line 21: Change "(unit: MN)" to -- (unit: MPa) --.

Column 10, Line 39: Change "there is" to -- there are --.

In the Claims

Column 16, Line 10: Change "butyl (methyl)acrylate" to -- butyl (meth)acrylate --.

Column 16, Line 19: Change "dimethacrylate" to -- di(meth)acrylate --.

Signed and Sealed this  
Twelfth Day of December, 2017

Joseph Matal  
*Performing the Functions and Duties of the*  
*Under Secretary of Commerce for Intellectual Property and*  
*Director of the United States Patent and Trademark Office*